US012660647B2

(12) United States Patent
Yang et al.

(10) Patent No.: US 12,660,647 B2
(45) Date of Patent: Jun. 16, 2026

(54) EDGE FILL FOR STACKED STRUCTURE

(71) Applicant: Taiwan Semiconductor Manufacturing Co., Ltd., Hsinchu (TW)

(72) Inventors: Su-Chun Yang, Hsinchu (TW); Jui Hsuan Tsai, Taipei (TW); Chiao-Chun Chang, Hsinchu (TW); Chu-Chuan Huang, Hsinchu (TW); Jih-Churng Twu, Hsinchu (TW); Chung-Shi Liu, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 456 days.

(21) Appl. No.: 18/310,293

(22) Filed: May 1, 2023

(65) Prior Publication Data

US 2024/0371818 A1 Nov. 7, 2024

(51) Int. Cl.
| | |
|---|---|
| H01L 23/495 | (2006.01) |
| H10W 70/60 | (2026.01) |
| H10W 70/685 | (2026.01) |
| *H10W 72/00* | (2026.01) |

(Continued)

(52) U.S. Cl.
CPC ........ H10W 70/611 (2026.01); H10W 70/685 (2026.01); H10W 72/0198 (2026.01); H10W 80/312 (2026.01); H10W 80/327 (2026.01); H10W 90/794 (2026.01)

(58) Field of Classification Search
CPC ..... H01L 24/80; H01L 23/5383; H01L 24/08; H01L 24/97; H01L 2224/08225; H01L 2224/08895; H01L 2224/80896; H01L 2224/97; H01L 2924/181; H01L 2224/48227; H01L 2224/0401; H01L 24/73; H01L 2224/32145; H01L 24/06; H01L 2224/48247; H01L 2224/48465; H01L 25/0655; H01L 2224/08145; H01L 2224/16227; H01L 23/3107; H01L 24/09; H01L 2224/04105; H01L 24/02; H01L 2224/48137; H01L 21/565; H01L 25/0652; H01L 2224/16145; H01L 23/53295; H01L 23/528; H01L 2224/48145; H01L 25/0657; H01L 24/05; H01L 25/105;

(Continued)

(56) References Cited

U.S. PATENT DOCUMENTS

| | | | |
|---|---|---|---|
| 2013/0052775 A1* | 2/2013 | Kim | .................... H10W 74/012 |
| | | | 438/118 |
| 2019/0371763 A1* | 12/2019 | Agarwal | ................. H01L 24/92 |
| 2020/0006145 A1* | 1/2020 | Li | ........................ H10D 84/038 |

FOREIGN PATENT DOCUMENTS

| | | |
|---|---|---|
| TW | 202230540 A | 8/2022 |
| TW | 202308015 A | 2/2023 |

(Continued)

*Primary Examiner* — Niki H Nguyen
(74) *Attorney, Agent, or Firm* — Slater Matsil, LLP

(57) ABSTRACT

A process includes depositing an edge fill dielectric over a first workpiece and a device disposed thereon. The edge fill dielectric is patterned so that only the edge portions remain. A second dielectric material is formed over the first workpiece, device, and edge fill dielectric. A planarization process levels the second dielectric material and the device. A bonding layer is formed thereon and a second workpiece bonded thereto by a dielectric-to-dielectric bond.

20 Claims, 16 Drawing Sheets

(51) Int. Cl.
*H10W 80/00* (2026.01)
*H10W 90/00* (2026.01)

(58) Field of Classification Search
CPC . H01L 2224/80357; H01L 2224/05008; H01L
2224/80001
See application file for complete search history.

(56) References Cited

FOREIGN PATENT DOCUMENTS

| | | | |
|---|---|---|---|
| TW | 202308066 | A | 2/2023 |
| WO | 2017123780 | A1 | 7/2017 |

* cited by examiner

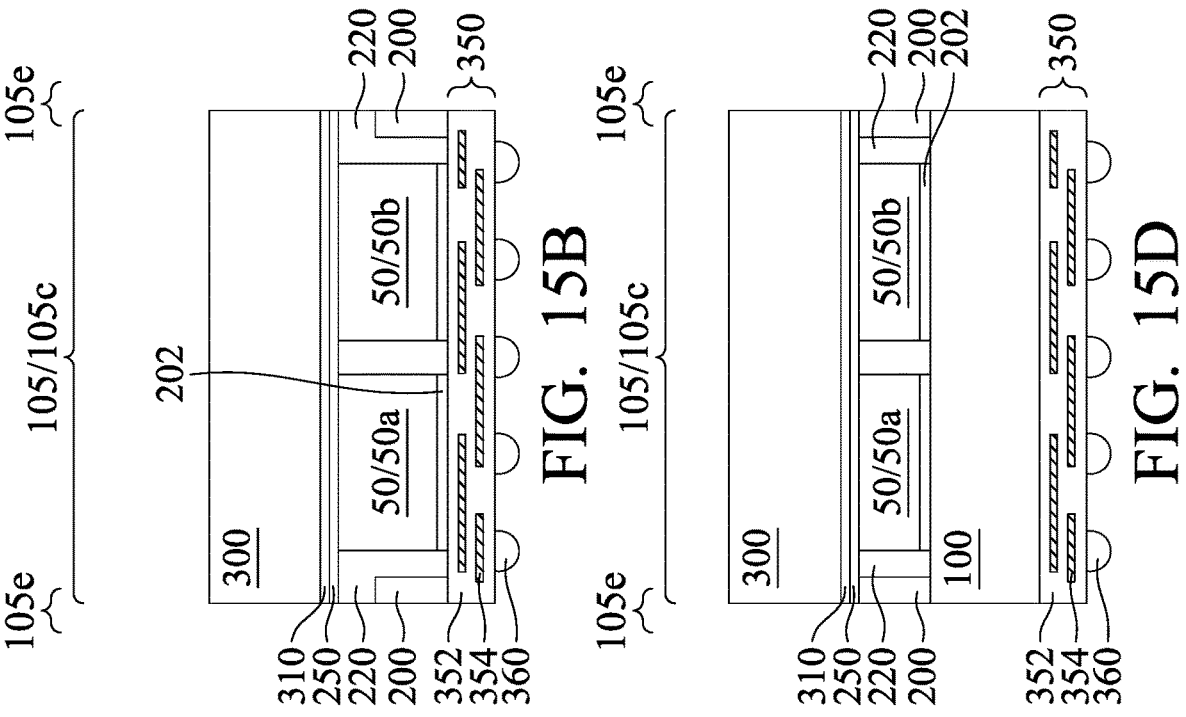
FIG. 15A
FIG. 15B
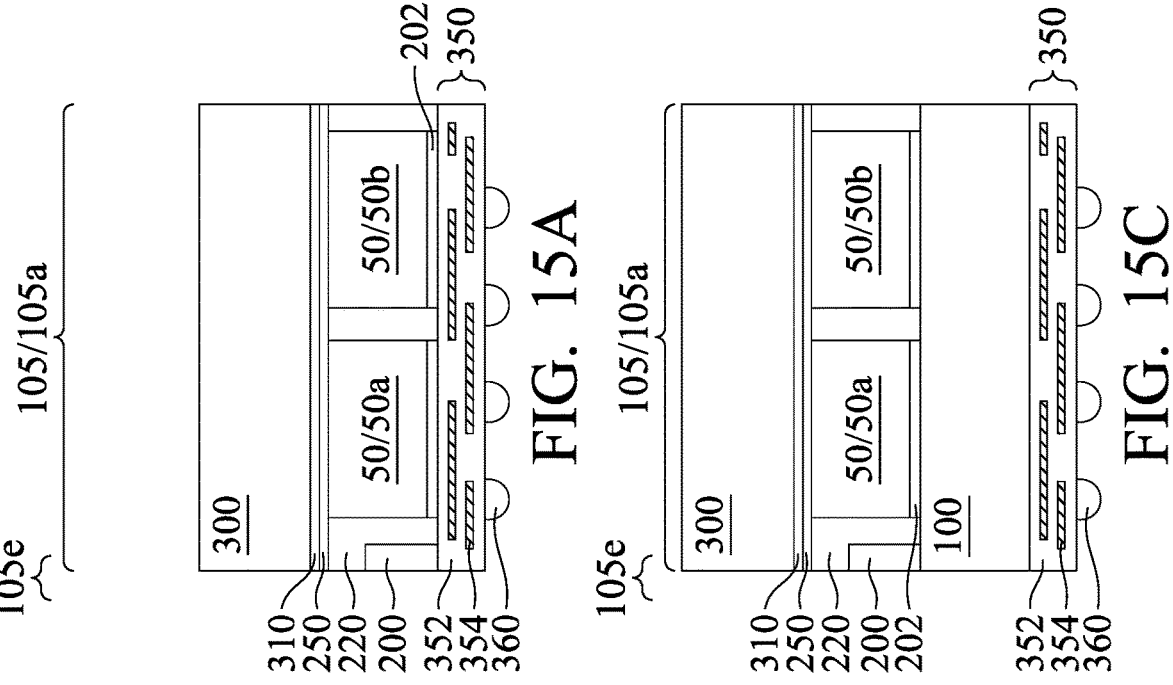
FIG. 15C
FIG. 15D

EDGE FILL FOR STACKED STRUCTURE

BACKGROUND

The semiconductor industry has experienced rapid growth due to ongoing improvements in the integration density of a variety of electronic components (e.g., transistors, diodes, resistors, capacitors, etc.). For the most part, improvement in integration density has resulted from iterative reduction of minimum feature size, which allows more components to be integrated into a given area. As the demand for shrinking electronic devices has grown, a need for smaller and more creative packaging techniques of semiconductor dies has emerged.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 3, 4, 5A, 5B, 6, 7A, 7B, 8, 9, 10, 11, 12, 13, 14, 15A, 15B, 15C, and 15D are cross-sectional views of intermediate stages in the manufacturing of integrated circuit packages, in accordance with various embodiments.

DETAILED DESCRIPTION

Figure 1:
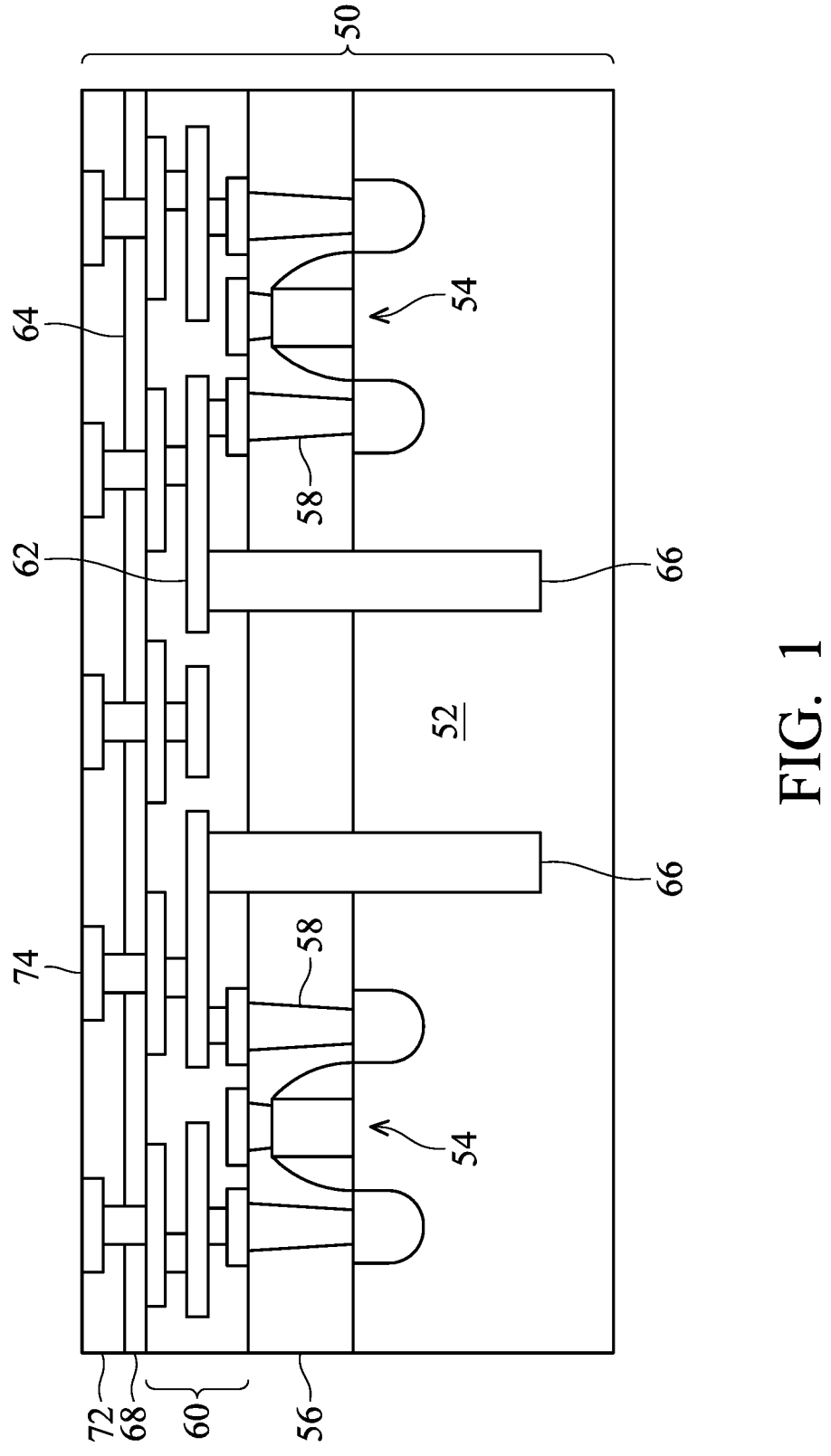
FIG. 1 is a cross-sectional view of an integrated circuit die, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "underlying," "below," "lower," "overlying," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Some three-dimensional stacked structures include embedded device dies. When encapsulating such dies, the encapsulant at the edges of the workpiece may slump due to a lack of embedded die disposed close to the edge of the workpiece. The slump causes a surface which is non-planar. When a subsequent workpiece is bonded to the first workpiece, the bonds at the edges are not as good and make cause delamination over time or contamination to seep into the interface from the workpiece edges. Embodiments address this issue by forming an edge fill dielectric layer prior to encapsulating the device dies. The edge fill dielectric provides lift to the second dielectric material and so the slump is reduced or eliminated.

FIG. 1 is a cross-sectional view of an integrated circuit die 50. The integrated circuit die 50 will be packaged in subsequent processing to form an integrated circuit device. The integrated circuit die 50 may be a logic die (e.g., central processing unit (CPU), graphics processing unit (GPU), system-on-a-chip (SoC), application processor (AP), micro-controller, etc.), a memory die (e.g., dynamic random access memory (DRAM) die, static random access memory (SRAM) die, etc.), a power management die (e.g., power management integrated circuit (PMIC) die), a radio frequency (RF) die, a sensor die, a micro-electro-mechanical-system (MEMS) die, a signal processing die (e.g., digital signal processing (DSP) die), a front-end die (e.g., analog front-end (AFE) dies), the like, or combinations thereof.

The integrated circuit die 50 may be formed in a wafer, which may include different device regions that are singulated in subsequent steps to form a plurality of integrated circuit dies. The integrated circuit die 50 may be processed according to applicable manufacturing processes to form integrated circuits. For example, the integrated circuit die 50 includes a semiconductor substrate 52, such as silicon, doped or undoped, or an active layer of a semiconductor-on-insulator (SOI) substrate. The semiconductor substrate 52 may include other semiconductor materials, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. Other substrates, such as multi-layered or gradient substrates, may also be used. The semiconductor substrate 52 has an active surface (e.g., the surface facing upwards in FIG. 1), sometimes called a front side, and an inactive surface (e.g., the surface facing downwards in FIG. 1), sometimes called a back side.

Devices 54 (represented by a transistor) are disposed at the active surface of the semiconductor substrate 52. The devices 54 may be active devices (e.g., transistors, diodes, etc.), capacitors, resistors, etc. For example, the devices 54 may be transistors that include gate structures and source/drain regions, where the gate structures are on channel regions, and the source/drain regions are adjacent the channel regions. The channel regions may be patterned regions of the semiconductor substrate 52. For example, the channel regions may be regions of semiconductor fins, semiconductor nanosheets, semiconductor nanowires, or the like patterned in the semiconductor substrate 52. When the devices 54 are transistors, they may be nanostructure field-effect transistors (Nanostructure-FETs), fin field-effect transistors (FinFETs), planar transistors, or the like.

An inter-layer dielectric 56 is disposed over the active surface of the semiconductor substrate 52. The inter-layer dielectric 56 surrounds and may cover the devices 54. The inter-layer dielectric 56 may include one or more dielectric layers formed of materials such as Phospho-Silicate Glass (PSG), Boro-Silicate Glass (BSG), Boron-Doped Phospho-Silicate Glass (BPSG), undoped Silicate Glass (USG), or the like, which may be formed by a deposition process such as chemical vapor deposition (CVD), atomic layer deposition (ALD), or the like. Contacts 58 extend through the interlayer dielectric 56 to electrically and physically couple the devices 54. For example, when the devices 54 are transistors, the contacts 58 may couple the gates and source/drain regions of the transistors. The contacts 58 may be formed of a suitable conductive material such as tungsten, cobalt, nickel, copper, silver, gold, aluminum, the like, or combinations thereof, which may be formed by a deposition process such as physical vapor deposition (PVD) or CVD, a plating process such as electrolytic or electroless plating, or the like.

An interconnect structure 60 is disposed over the interlayer dielectric 56 and contacts 58. The interconnect structure 60 interconnects the devices 54 to form an integrated circuit. The interconnect structure 60 may be formed of, for example, metallization patterns 62 in dielectric layers 64. The dielectric layers 64 may be, e.g., low-k dielectric layers. The metallization patterns 62 include metal lines and vias, which may be formed in the dielectric layers 64 by a damascene process, such as a single damascene process, a dual damascene process, or the like. The metallization patterns 62 may be formed of a suitable conductive material, such as copper, tungsten, aluminum, silver, gold, a combination thereof, or the like. The metallization patterns 62 are electrically coupled to the devices 54 by the contacts 58.

The conductive vias 66 extend into the interconnect structure 60 and/or the semiconductor substrate 52. The conductive vias 66 are electrically coupled to the metallization patterns 62 of the interconnect structure 60. The conductive vias 66 may be through-substrate vias, such as through-silicon vias. As an example to form the conductive vias 66, recesses can be formed in the interconnect structure 60 and/or the semiconductor substrate 52 by, for example, etching, milling, laser techniques, a combination thereof, or the like. A thin barrier layer may be conformally deposited in the recesses, such as by CVD, atomic layer deposition (ALD), physical vapor deposition (PVD), thermal oxidation, a combination thereof, or the like. The barrier layer may be formed from an oxide, a nitride, a carbide, combinations thereof, or the like. A conductive material may be deposited over the barrier layer and in the recesses. The conductive material may be formed by an electro-chemical plating process, CVD, ALD, PVD, a combination thereof, or the like. Examples of conductive materials include copper, tungsten, aluminum, silver, gold, a combination thereof, or the like. Excess conductive material and barrier layer is removed from a surface of the interconnect structure 60 or the semiconductor substrate 52 by, for example, a chemical-mechanical polish (CMP). The remaining portions of the barrier layer and conductive material in the recesses form the conductive vias 66.

In this embodiment, the conductive vias 66 are formed by a via-middle process, such that the conductive vias 66 extend through a portion of the interconnect structure 60 (e.g., a subset of the dielectric layers 64) and extend into semiconductor substrate 52. The conductive vias 66 formed by a via-middle process are connected to a middle metallization pattern 62 of the interconnect structure 60. In another embodiment, the conductive vias 66 are formed by a via-first process, such that the conductive vias 66 extend into the semiconductor substrate 52 but not the interconnect structure 60. The conductive vias 66 formed by a via-first process are connected to a lower metallization pattern 62 of the interconnect structure 60. In yet another embodiment, the conductive vias 66 are formed by a via-last process, such that the conductive vias 66 extend through an entirety of the interconnect structure 60 (e.g., each of the dielectric layers 64) and extend into the semiconductor substrate 52. The conductive vias 66 formed by a via-last process are connected to the upper metallization pattern 62 of the interconnect structure 60.

One or more passivation layer(s) 68 are disposed on the interconnect structure 60. The passivation layer(s) 68 may be formed of one or more suitable dielectric materials such as silicon oxynitride, silicon nitride, low-k dielectrics such as carbon doped oxides, extremely low-k dielectrics such as porous carbon doped silicon oxide, a polymer such as polyimide, solder resist, polybenzoxazole (PBO), a benzocyclobutene (BCB) based polymer, molding compound, the like, or a combination thereof. The passivation layer(s) 68 may be formed by chemical vapor deposition (CVD), spin coating, lamination, the like, or a combination thereof. In some embodiments, the passivation layer(s) 68 include a silicon oxynitride layer or a silicon nitride layer.

A dielectric layer 72 is disposed on the passivation layer(s) 68. The dielectric layer 72 may be formed of an oxide such as silicon oxide, phosphosilicate glass (PSG), borosilicate glass (BSG), boron-doped phosphosilicate glass (BPSG), a tetraethyl orthosilicate (TEOS) based oxide, or the like; a nitride such as silicon nitride or the like; a polymer such as PBO, polyimide, a BCB-based polymer, or the like; a combination thereof; or the like. The dielectric layer 72 may be formed, for example, by CVD, spin coating, lamination, or the like. In some embodiments, the dielectric layer 72 is formed of TEOS-based silicon oxide.

Die connectors 74 extend through the dielectric layer 72 and the passivation layer(s) 68. The die connectors 74 may include conductive pillars, pads, or the like, to which external connections can be made. In some embodiments, the die connectors 74 include bond pads at the front-side surface of the integrated circuit die 50, and include bond pad vias that connect the bond pads to the upper metallization pattern 62 of the interconnect structure 60. In such embodiments, the die connectors 74 (including the bond pads and the bond pad vias) may be formed by a damascene process, such as a single damascene process, a dual damascene process, or the like. The die connectors 74 can be formed of a conductive material, such as a metal, such as copper, aluminum, or the like, which can be formed by, for example, plating, or the like.

Optionally, solder regions (not separately illustrated) may be disposed on the die connectors 74 during formation of the integrated circuit die 50. The solder regions may be used to perform chip probe (CP) testing on the integrated circuit die 50. For example, the solder regions may be solder balls, solder bumps, or the like, which are used to attach a chip probe to the die connectors 74. Chip probe testing may be performed on the integrated circuit die 50 to ascertain whether the integrated circuit die 50 is a known good die (KGD). Thus, only integrated circuit dies 50, which are KGDs, undergo subsequent processing are packaged, and dies which fail the chip probe testing are not packaged. After testing, the solder regions may be removed in subsequent processing steps.

In some embodiments, the integrated circuit die 50 is a stacked device that includes multiple semiconductor substrates 52. For example, the integrated circuit die 50 may be a memory device that includes multiple memory dies such as a hybrid memory cube (HMC) device, a high bandwidth memory (HBM) device, or the like. In such embodiments, the integrated circuit die 50 includes multiple semiconductor substrates 52 interconnected by through-substrate vias (TSVs) such as through-silicon vias. Each of the semiconductor substrates 52 may (or may not) have a separate interconnect structure 60.

Figure 2:
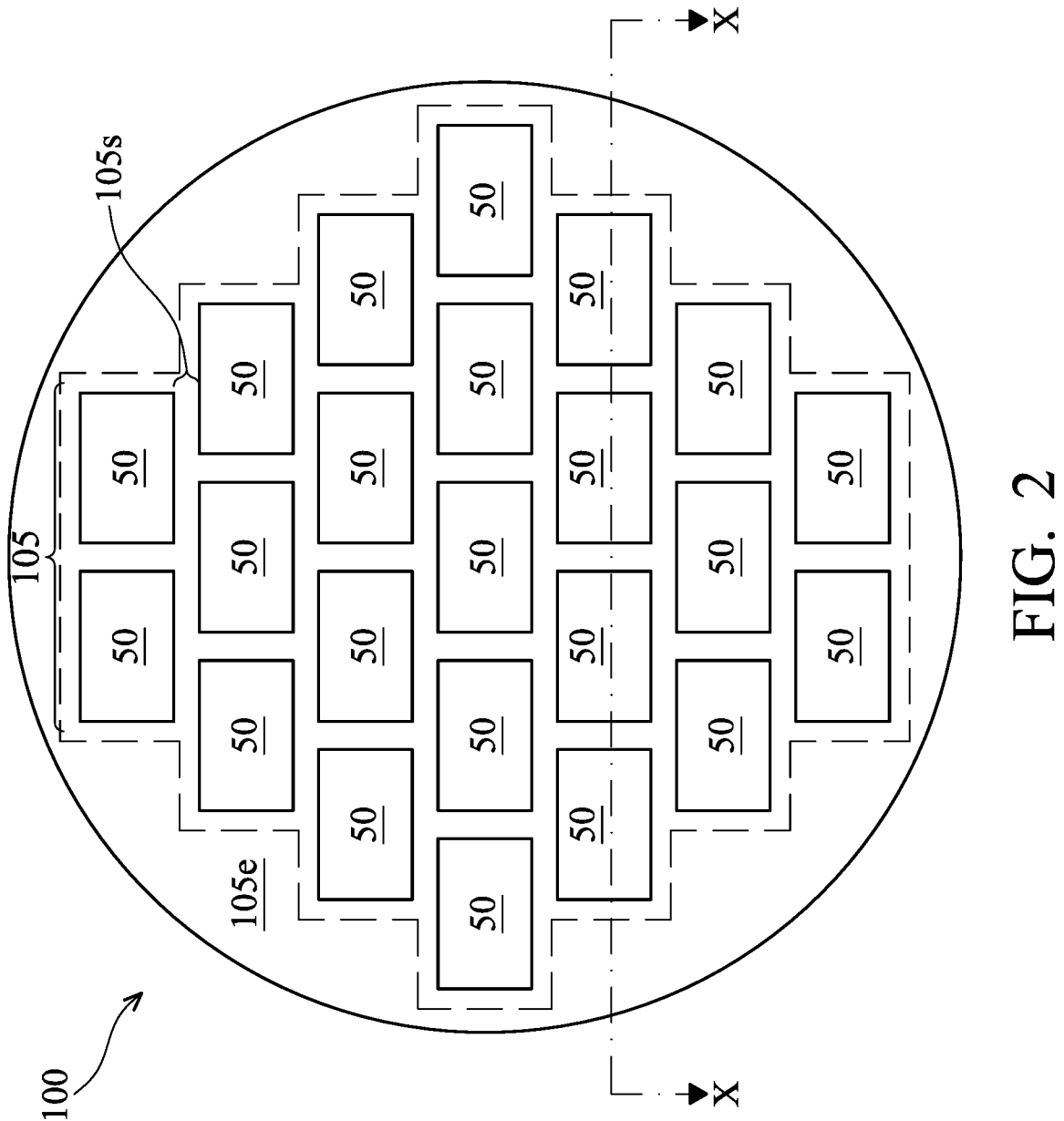
FIG. 2 is a top down view of a workpiece with package regions defined therein, in accordance with some embodiments.

FIG. 2 illustrates a top down view of a workpiece 100 which has multiple ones of the integrated circuit dies 50 attached thereto. The integrated circuit dies 50 are arranged in a brick pattern, however, other patterns or other arrangements, including a random arrangement may be used. Scribe lines 105s are disposed between package regions 105, which may include one or more of the integrated circuit dies 50. At a subsequent process, multiple packages may be singulated from the workpiece 100 and overlying structures by cutting along the scribe lines 105s. FIGS. 3-14, discussed below, include cross-sectional views along the reference line X-X.

Although each of the dies illustrated in FIG. 2 are labeled as integrated circuit dies 50, it should be understood that not all dies need be the same die type. Indeed, such packages regions may be configured to incorporate several different die types. Further, although the package regions discussed below are discussed in terms of including one or two of the integrated circuit dies 50, any number of the integrated circuit dies 50 of any types and multiple types may be included.

As illustrated in FIG. 2, an area between package regions include scribe lines 105s which are used to singulate the workpiece 100 into individual device packages. An edge region 105e surrounding the integrated circuit dies and extending to the edge of the wafer is illustrated in a dashed outline. Portions of the edge region 105e may be included within the package regions 105.

Figure 3:
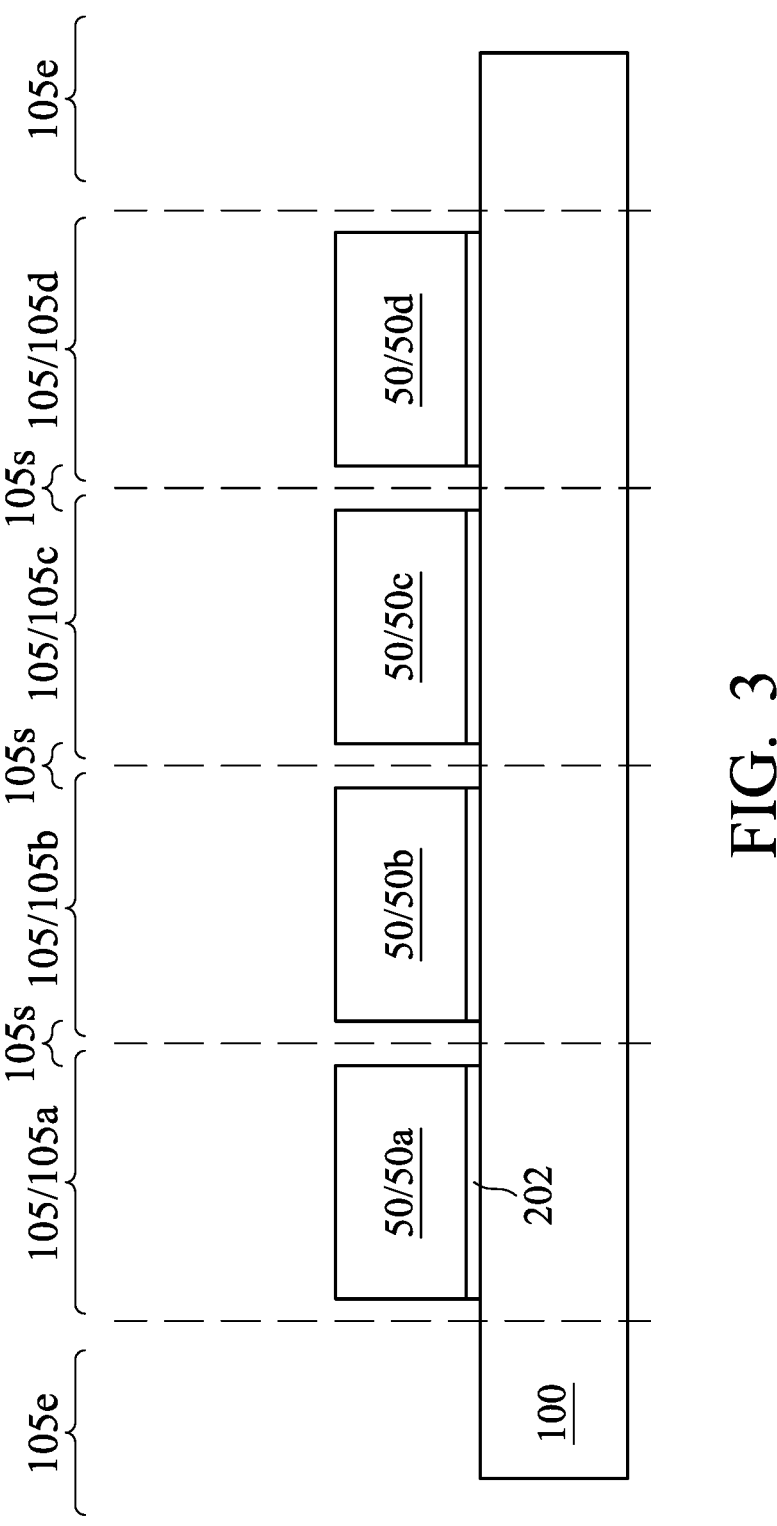

Referring now to FIG. 3, in some embodiments, the workpiece 100 may be a device wafer, including multiple device areas. In other embodiments the workpiece 100 may be a carrier on which the package regions 105 are formed. In yet other embodiments, the workpiece 100 may be an interposer structure or wafer. In still other embodiments, the workpiece may be a prepared substrate.

In embodiments where the workpiece 100 is a carrier substrate, the workpiece 100 may be a glass carrier substrate, a ceramic carrier substrate, or the like. In embodiments where the workpiece 100 is an interposer, the workpiece 100 may include a semiconductor substrate, dielectric substrate, or the like with through vias disposed therethrough. A metallization structure, such as an interconnect, may be disposed on one or both sides of the workpiece 100. Passive devices may be incorporated into the interposer. In embodiments, where the workpiece 100 includes a prepared substrate, the substrate may include a core substrate with metallization layers, such as laminated foil layers, disposed thereover.

In embodiments where the workpiece 100 is a device substrate, the workpiece 100 includes a semiconductor substrate and devices formed at a top surface of the semiconductor substrate. The semiconductor substrate may be formed of crystalline silicon, crystalline germanium, crystalline silicon germanium, and/or a III-V compound semiconductor such as GaAsP, AlInAs, AlGaAs, GaInAs, GaInP, GaInAsP, and the like. The semiconductor substrate may also be a bulk silicon substrate or a Silicon-On-Insulator (SOI) substrate. The semiconductor substrate may also include shallow trench isolation regions to separate device areas and through-vias extending into semiconductor substrate to electrically inter-couple the features on opposite sides of workpiece 100. In accordance with some embodiments of the present disclosure, workpiece 100 includes devices which are formed on the top surface of the workpiece 100. Example devices may include Complementary Metal-Oxide Semiconductor (CMOS) transistors, resistors, capacitors, diodes, and/or the like. The details of the devices (if any) are not illustrated herein.

Integrated circuit dies 50 are attached to the workpiece. The integrated circuit dies 50 may be attached in a face-down manner, such that the front-sides of the integrated circuit dies 50 are attached to the workpiece 100 or may be attached in a face-up manner, such that the back-sides of the integrated circuit dies 50 are attached to the workpiece 100. At least one integrated circuit die 50 is placed in each package region 105, such as package regions 105a and 105b. The integrated circuit dies 50 may be placed by, e.g., a pick-and-place process. The integrated circuit dies 50 may be logic devices, such as CPUs, GPUs, SoCs, microcontrollers, or the like.

The integrated circuit dies 50 may be attached to the workpiece 100 by bonding the integrated circuit dies 50 to the workpiece 100 with a bonding film 202. The bonding film 202 may be disposed on the contacting surface of the integrated circuit dies and/or the surface of the workpiece 100. In some embodiments, the bonding film 202 is a release layer, such as an epoxy-based thermal-release material, which loses its adhesive property when heated, such as a light-to-heat-conversion (LTHC) release coating; an ultra-violet (UV) glue, which loses its adhesive property when exposed to UV lights; or the like. In some embodiments, the bonding film 202 is an adhesive, such as a suitable epoxy, die attach film (DAF), or the like. In some embodiments, the bonding film 202 is an oxide layer such as a layer of silicon oxide. The bonding film 202 may include any desired quantity of release layers and/or adhesive films. In some embodiments, the bonding film 202 includes a first bonding film applied to the contacting side of the integrated circuit dies 50 and a second bonding film applied on the surface of the workpiece prior to the placement of the integrated circuit dies 50.

At this stage of processing, the integrated circuit dies 50 may not yet include the dielectric layer 72 or the die connectors 74 (previously described for FIG. 1). As such, the upper passivation layers 68 of the respective integrated circuit dies 50 may be attached to the workpiece 100. In such embodiments, die connectors for the integrated circuit dies 50 may be subsequently formed.

FIG. 3 further includes the package regions 105, scribe lines 105s, and edge regions 105e. In FIG. 3, the package regions 105a, 105b, 105c, and 105d, for example each include a respective integrated circuit die 50a, 50b, 50c, and 50d.

Figure 4:
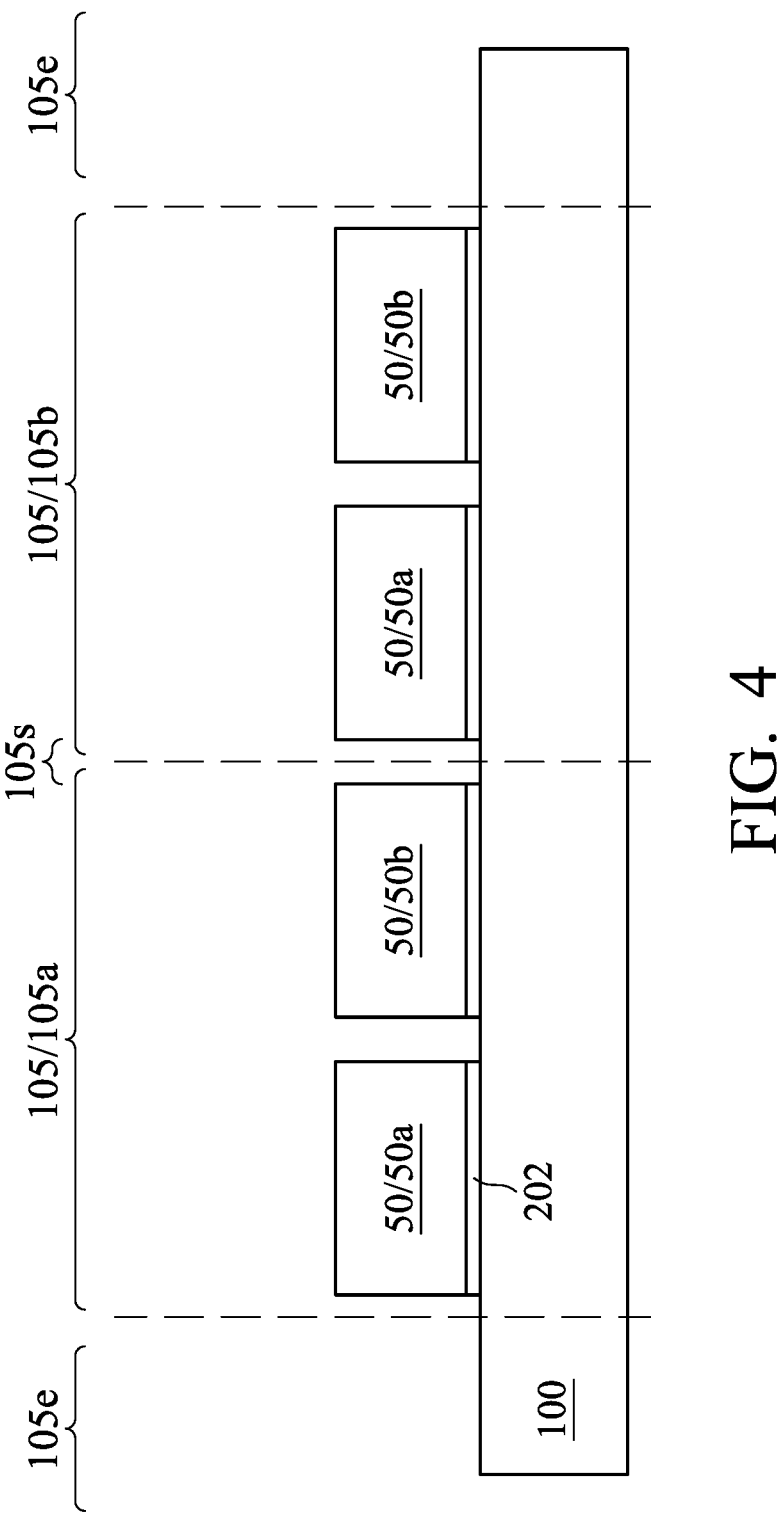

In FIG. 4, however, the package regions 105a and 105b, for example, each include integrated circuit dies 50a and 50b. The embodiments illustrated in FIGS. 3 and 4 illustrate that each of the integrated circuit dies 50 may be different or the same and the one or multiples of the integrated circuit dies 50 may be used. Although each of the integrated circuit dies 50 are illustrated as having the same size, it should be appreciated that each of the integrated circuit dies 50 may have different sizes. For the sake of clarity, only the example structure illustrated in FIG. 4 is illustrated in the continuing Figures, though it should be understood that the structure of FIG. 3 may be substituted.

Figure 5A:
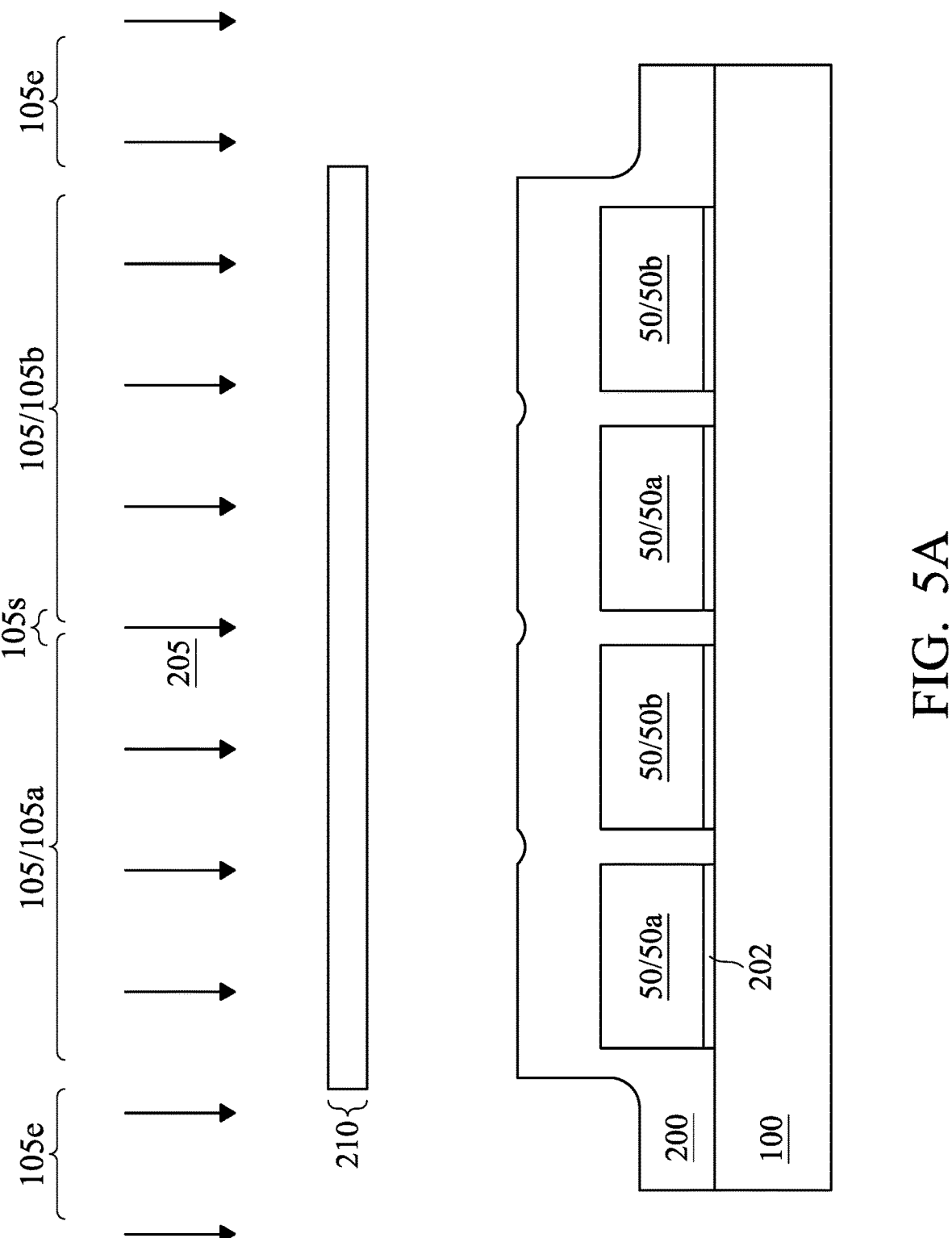
Figure 5B:
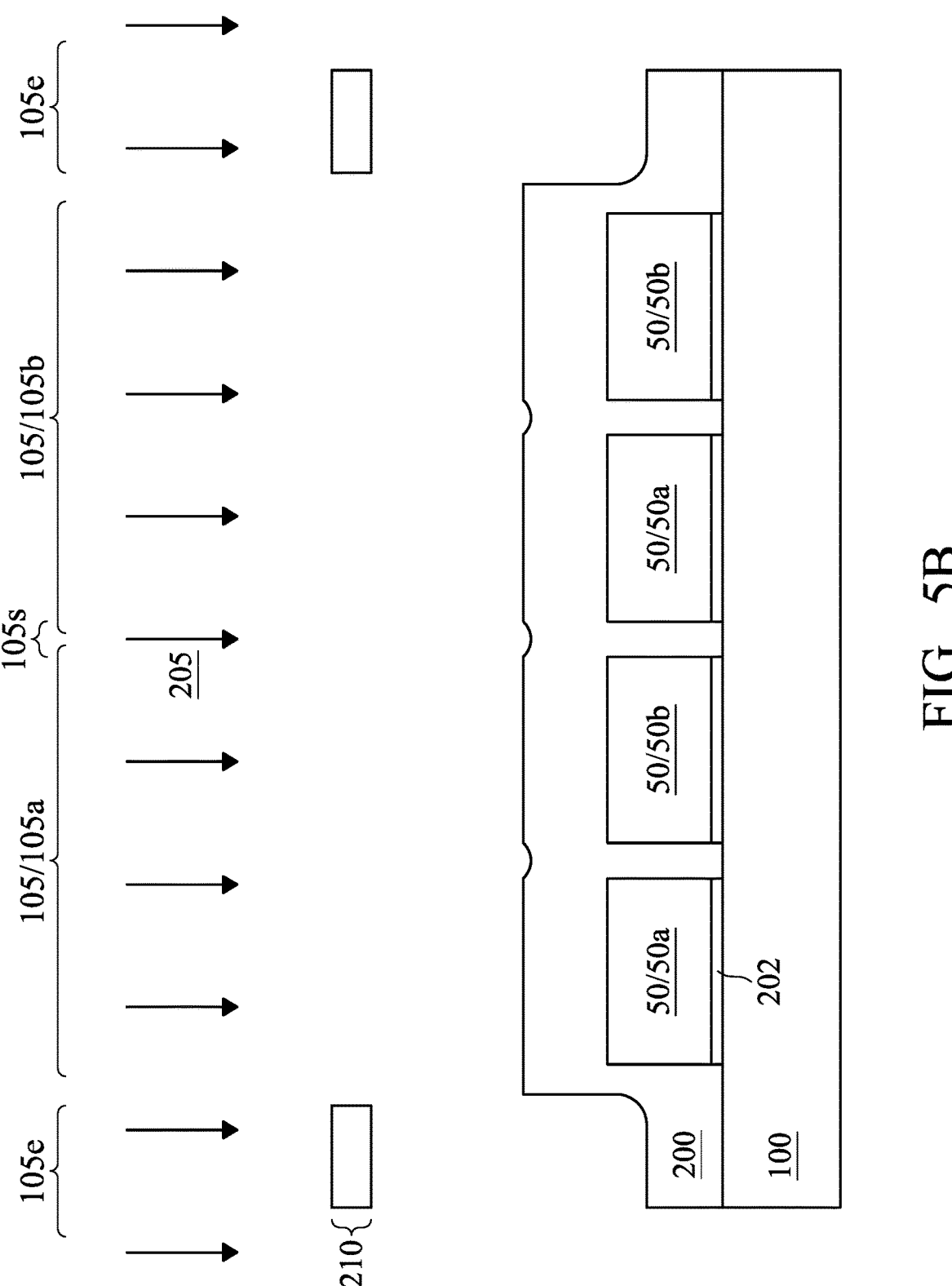

In FIGS. 5A and 5B a first dielectric layer 200 is deposited over the workpieces 100 and integrated circuit dies 50 by the deposition process 205. The first dielectric layer 200 may be deposited using any suitable process, such as by CVD, PVD, spin-on, flowable CVD, and the like, and is a photosensitive material, including any suitable photosensitive dielectric material, such as a polymer, polyimide, silicone spin-onglass (SoG), benzocyclobutene (BCB), polybenzoxozoles (PBO), the like, or combinations thereof. After depositing the material of the first dielectric layer 200, it is developed by a photopatterning process where a light is shown through a light mask 210, and then cured. In FIG. 5A, the first dielectric layer 200 is a negative tone dielectric material so that everywhere that is not exposed to light is removed during the developing process. In FIG. 5B, the first dielectric layer 200 is a positive tone dielectric material so that everywhere that is exposed to light is removed. Thus, the mask 210 is selected based on whether the first dielectric layer 200 has a negative tone or positive tone.

Figure 6:
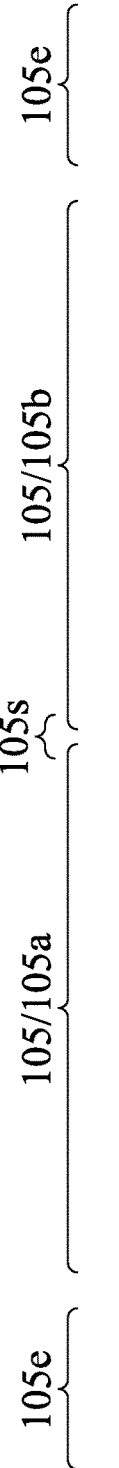
Figure 6:
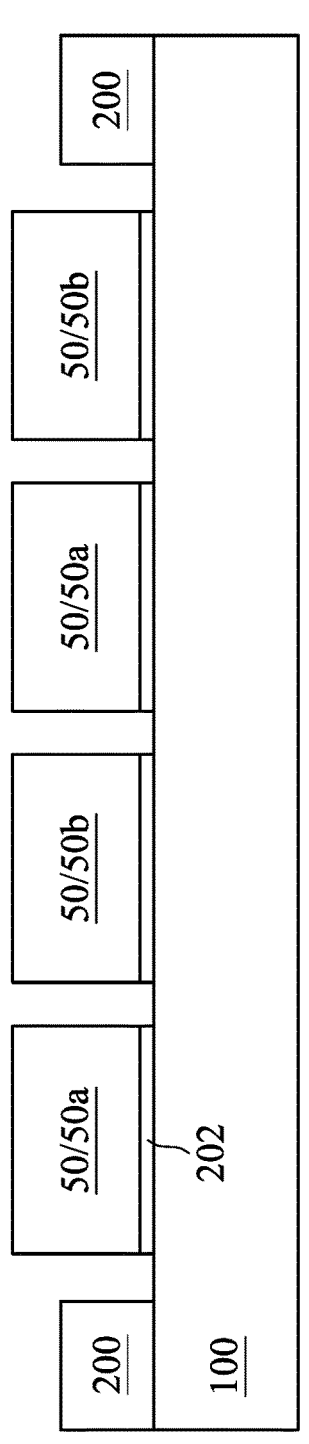

The result from either process of FIGS. 5A and 5B is illustrated in FIG. 6, where the photosensitive material of the first dielectric layer 200 has been developed and cured into the first dielectric layer 200. As illustrated in FIG. 6, the first dielectric layer 200 is disposed in the edge region 105e of the workpiece 100. This first dielectric layer 200 in the edge region 105e fills the edge region 105e so that a subsequently deposited dielectric layer achieves good planarity whereas it would tend to slump toward the edges of the workpiece 100.

Figure 7A:
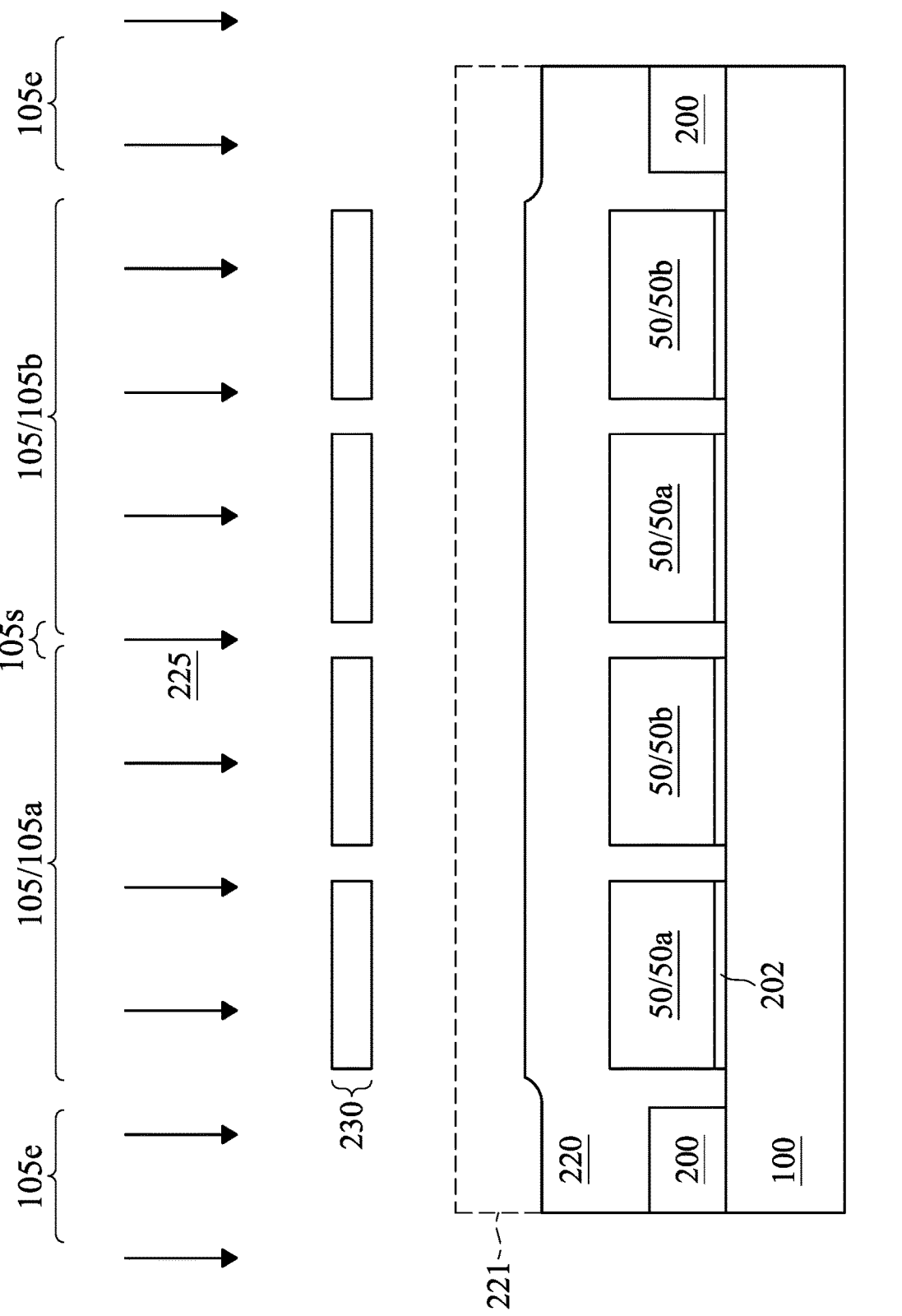
Figure 7B:
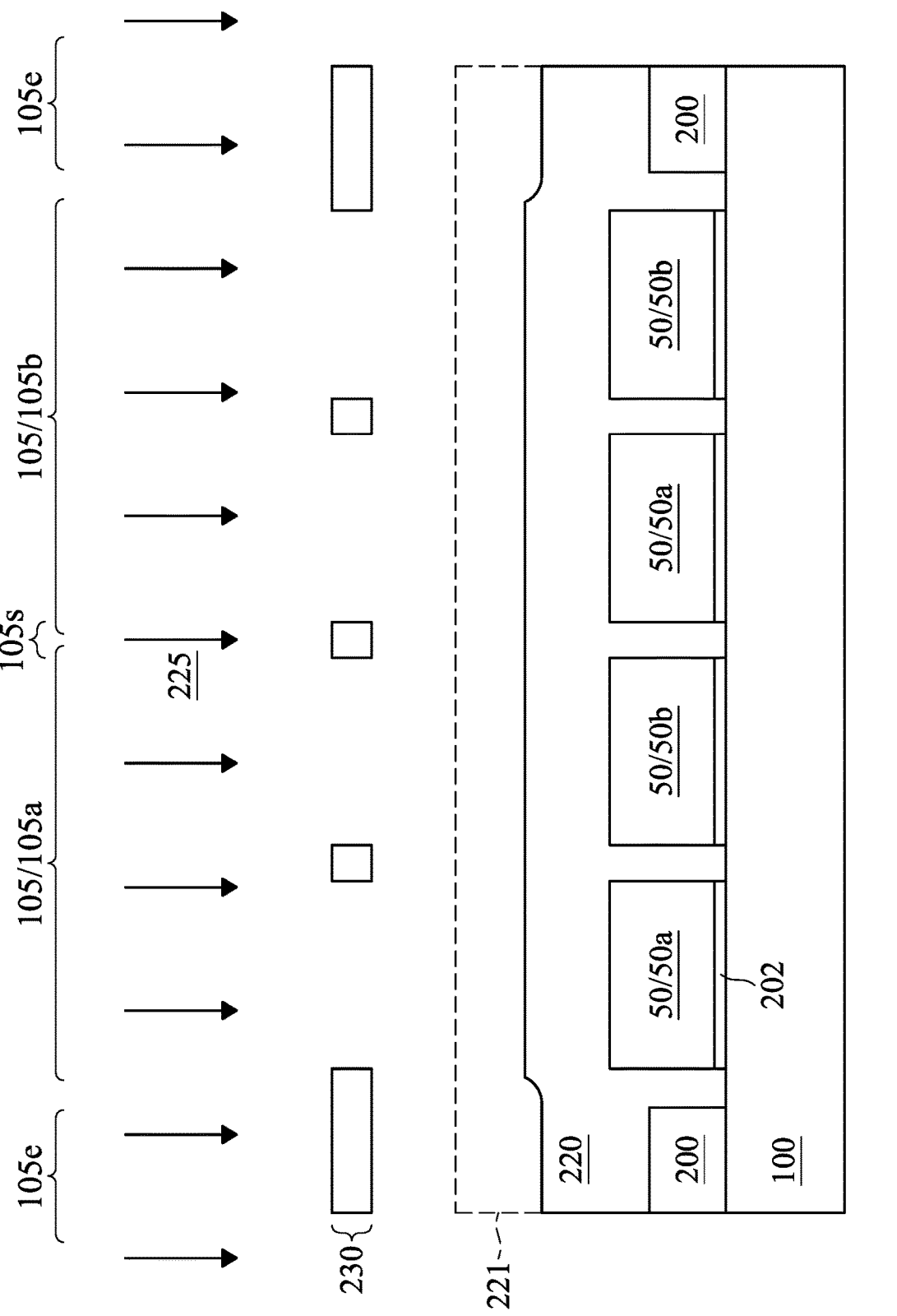

In FIGS. 7A and 7B, a second dielectric layer 220 is deposited in a deposition process 225 over the workpiece 100, including over the first dielectric layer 200 and the integrated circuit dies 50. The second dielectric layer 220 may be a photosensitive dielectric material and may be deposited using processes and materials similar to those described above with respect to the first dielectric layer 200. In some embodiments, the materials of the first dielectric layer 200 and the second dielectric layer 220 may be different, while in other embodiments, the material may be the same. In some embodiments, the second dielectric layer 220 may not be photosensitive. In such embodiments, the second dielectric layer 220 may be deposited using any suitable process, such as by CVD, PVD, spin-on, flowable CVD, and the like, and may include any suitable dielectric material, such as silicon oxide (such as a TEOS formed silicon oxide), silicone (SoG), benzocyclobutene (BCB), polybenzoxozoles (PBO), polyimide (PI), the like, or combinations thereof. In such embodiments, the patterning process may be accomplished with a separate photoresist mask 221 (shown in dashed outline) and etch process.

When the second dielectric layer 220 is a photosensitive dielectric material, in FIG. 7A, it may be a negative tone dielectric material, while in FIG. 7B it may be a positive tone dielectric material. The light mask 230 is configured to keep the portions of the second dielectric layer 220 over the first dielectric layer 200 and between the integrated circuit dies 50.

When the second dielectric layer 220 is not photosensitive, a photoresist mask 221 may be deposited over the second dielectric layer and then exposed, developed, and cured in a manner similar to that used when the second dielectric layer 220 is photosensitive. The photoresist mask 221 may be positive tone or negative tone. The light mask 230 is configured to keep the portions of the photoresist mask 221 over the first dielectric layer 200 and between the integrated circuit dies 50. Then upon developing and curing, the photoresist mask 221 may be used as an etch mask to remove the expose portions of the second dielectric layer 220. Following the etch, the photoresist mask 221 may be removed by a suitable process, such as by an ashing process.

Figure 8:
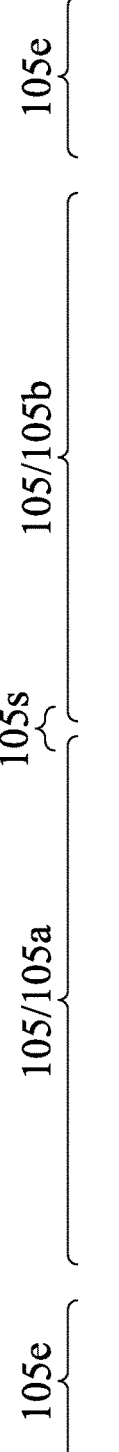
Figure 8:
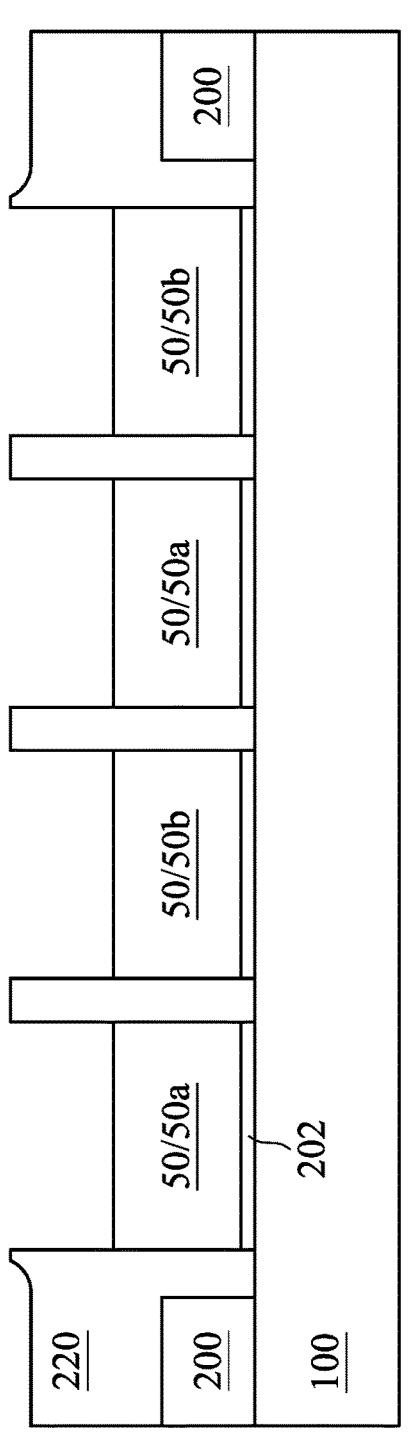

The result from either process of FIGS. 7A and 7B is illustrated in FIG. 8. As seen in FIG. 8, the portion of the second dielectric layer 220 is removed from over the integrated circuit dies 50. When configured in such a manner, a subsequent leveling process may be accomplished more quickly because less material needs to be removed.

Figure 9:
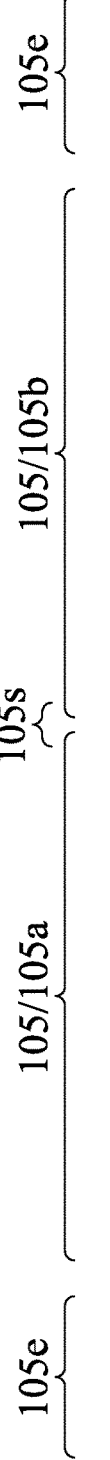
Figure 9:
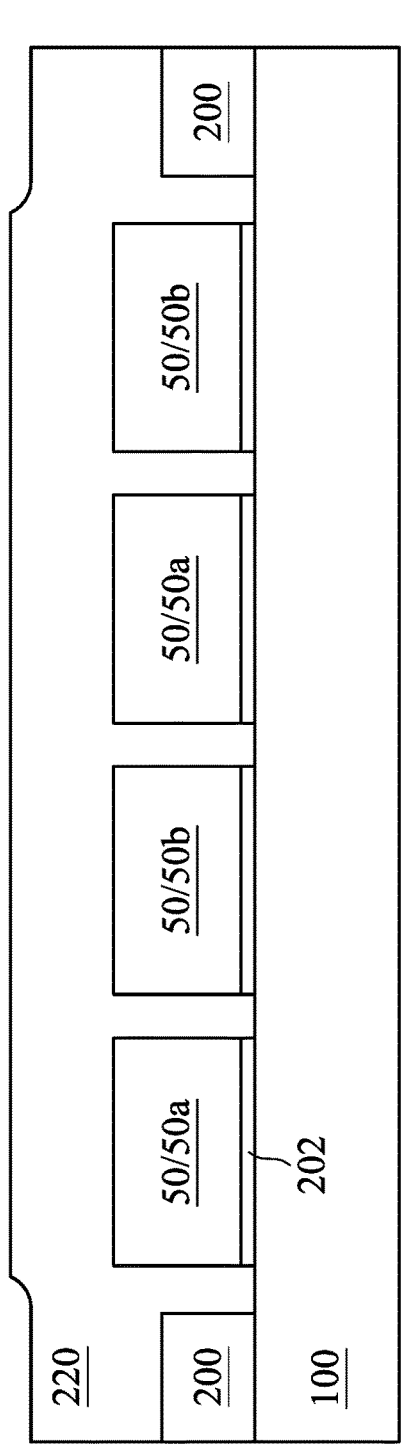

FIG. 9 illustrates another process of depositing the second dielectric layer 220. In FIG. 9, the second dielectric layer 220 is deposited using any suitable process and materials, such as those discussed above for FIGS. 5A, 5B, 7A, and 7B. However the second dielectric layer 220 of FIG. 9 is not patterned. Thus, in such embodiments, the material of the second dielectric layer 220 may not be photosensitive. If photosensitive materials are selected, however, a positive tone material may be used and cured without the need to develop. A negative tone material may be used and exposed to light all over in a developing step, essentially without the need of a light mask.

Figures 10, 11:
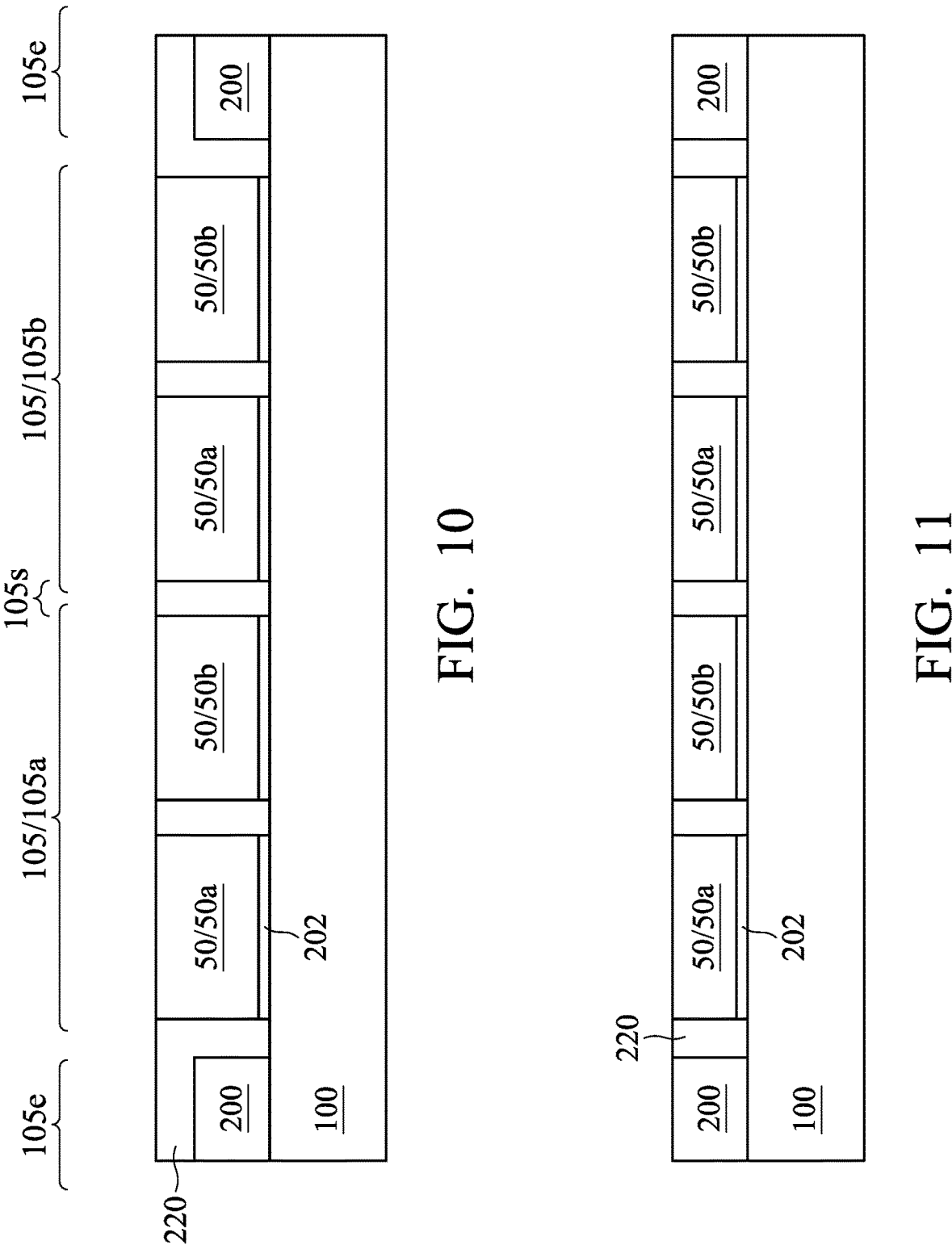

In FIGS. 10 and 11, a planarization process or leveling process, such as a chemical mechanical polishing process (CMP), grinding process, etching process, or combination thereof may be used on the structure of FIG. 8 or FIG. 9 to remove portions of the second dielectric layer 220 to level an upper surface of the second dielectric layer 220 with upper surfaces of the integrated circuit dies 50. In FIG. 11, in some embodiments, the planarization process may be continued to partially thin the integrated circuit dies 50 (e.g., if they are face down) and/or remove the portions of the second dielectric layer 220 which lie on top of the first dielectric layer 200.

Due to the first dielectric layer 200 in the edge region 105e, the planarity of the upper surface is better than without the separate first dielectric layer 200 in the edge region 105e. Instead, the dielectric layer would tend to slump at the edges and it would be difficult to achieve a wafer-to-wafer bond with the resulting structure with good bonding all the way to the edge.

Figure 12:
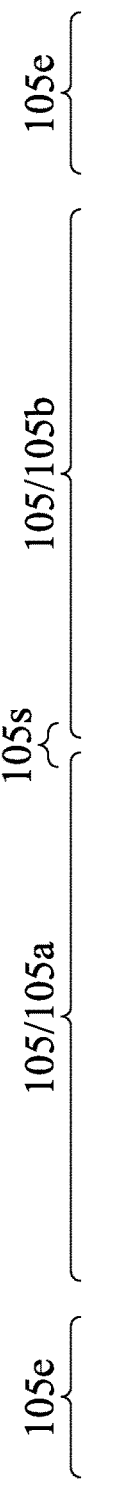
Figure 12:
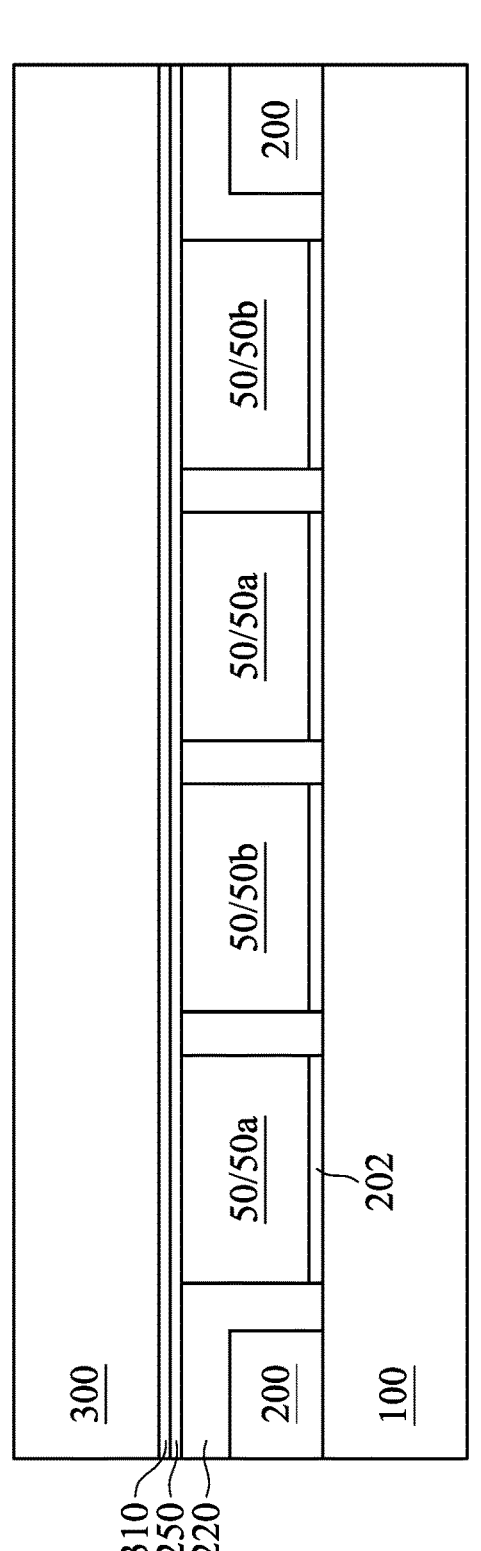

In FIG. 12, a dielectric bonding layer 250 may be formed over the first dielectric layer 200, second dielectric layer 220, and integrated circuit dies 50. The dielectric bonding layer 250 may be any suitable material, such a silicon oxide or a silicon oxide-based material, formed by spin on, or other suitable process. A second workpiece 300 is bonded to the dielectric bonding layer 250 by a second dielectric bonding layer 310. The workpiece 300 may be a wafer, carrier, interposer, prepared substrate, or the like, such as described above with respect to the workpiece 100. The second dielectric bonding layer 310 may be provided with the workpiece 300 or may be deposited over the workpiece 300 using processes and materials similar to that of the dielectric bonding layer 250.

The dielectric bonding layer 250 may be bonded to the second dielectric bonding layer 310 by fusing the dielectric bonding layer 250 with the dielectric bonding layer 310, for example, by forming crosslinking Si—O—Si bonds. The workpiece 300 is positioned in relation to the workpiece 100 and pressed together. Then, an anneal is performed to cause the crosslinking dielectric bonds. The annealing temperature may be lower than 400° C., and may be in the range between about 200° C. and about 400° C. in accordance with some embodiments. The annealing time may be in the range between about 1 hours and about 3.0 hours, and may be in the range between about 0.5 hour and about 2.5 hours in accordance with some embodiments.

Because of the good planarity of the dielectric bonding layer 250 due to using the first dielectric layer 200 to fill in the edge region of the workpiece 100, the density of bonds from the dielectric bonding layer 250 to the dielectric bonding layer 310 are consistent from the middle of the workpiece 100/300 to the edge of the workpieces 100/300.

Figure 13:
Figure 13:
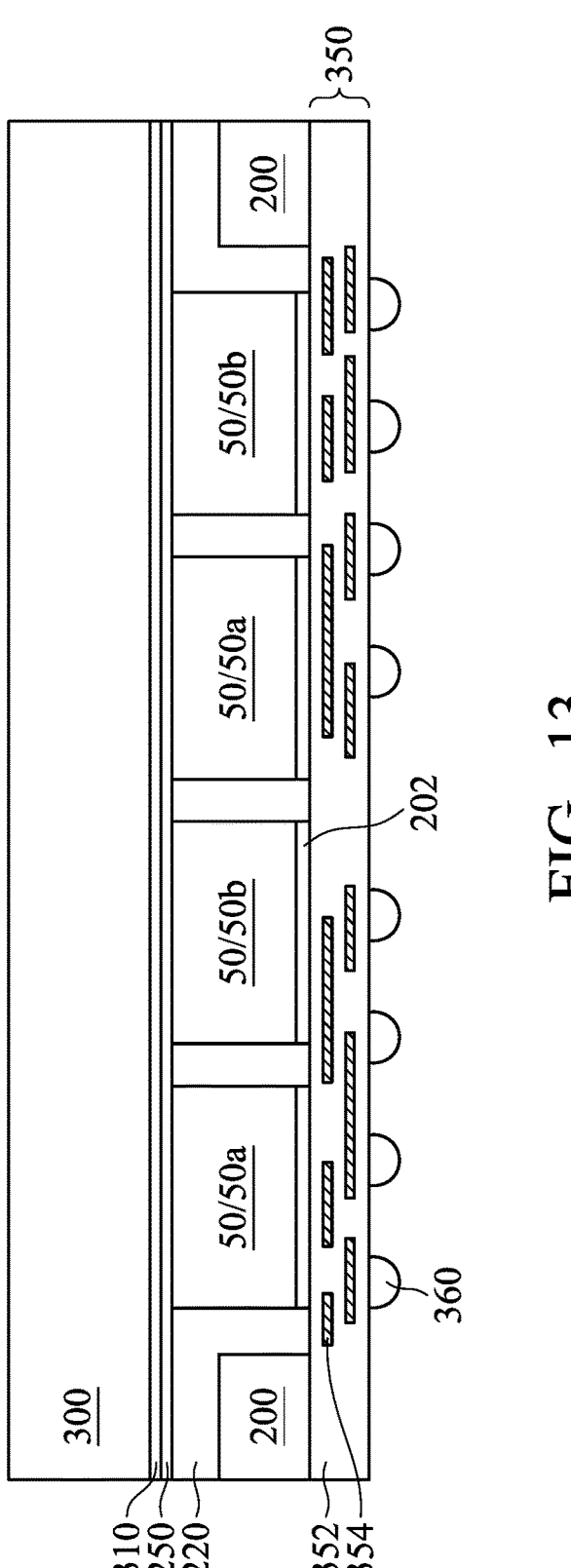

In FIG. 13, an interconnect 350 may be formed over the structure, in this instance opposite the workpiece 300. In embodiments where the workpiece 100 is a carrier, the workpiece 100 may be removed prior to forming the interconnect 350. The workpiece 100 may, in such, instances be removed by grinding or by activating the release characteristics of the bonding film 202 to release the adhesive attaching the workpiece 100 to the remaining portions of the structure of FIG. 12.

The interconnect 350 may be formed by depositing a dielectric layer 352, forming via openings through the dielectric layer 352, depositing a patterned metallization layer 354 over the dielectric layer 352 and in the via openings, and repeating this process until a desired number of patterned metallization layers are achieved. A final dielectric layer may be deposited to complete the interconnect 350.

The patterned metallization layers 354 may be formed of copper or copper alloys, and they can also be formed of other metals. The formation process may include single damascene and dual damascene processes. In a single damascene process, a trench is first formed in one of dielectric layers 352, followed by filling the trench with a conductive material. A planarization process such as a CMP process is then performed to remove the excess portions of the conductive material higher than the top surface of the dielectric layers 35, leaving a metal line in the trench. In a dual damascene process, both a trench and a via opening are formed in a dielectric layer 352, with the via opening underlying and connected to the trench. The conductive material is then filled into the trench and the via opening to form a metal line and a via, respectively, as the patterned metallization layer 354. The conductive material may include a diffusion barrier and a copper-containing metallic material over the diffusion barrier. The diffusion barrier may include titanium, titanium nitride, tantalum, tantalum nitride, or the like.

The dielectric layers 352 may be formed of any suitable material, such as a low-k dielectric material, such as carbon doped oxides, porous carbon doped silicon oxide, a polymer such as polyimide, solder resist, polybenzoxazole (PBO), a benzocyclobutene (BCB) based polymer, molding compound, or the like. The final dielectric layer may be formed of a non-low-k dielectric material such as Un-doped Silicate Glass (USG), silicon oxide, silicon nitride, or the like, or a low-k material such as those listed herein.

Next, connectors 360 may be formed. The connectors 360 may include Under-Bump Metallurgies (UBMs), extending into the top dielectric layer 352 to contact metallization layers 354 of the interconnect 350. In accordance with some embodiments of the present disclosure, each of UBMs (if used) includes a barrier layer (not shown) and a seed layer (not shown) over the barrier layer. The barrier layer may be a titanium layer, a titanium nitride layer, a tantalum layer, a tantalum nitride layer, or a layer formed of a titanium alloy or a tantalum alloy. The materials of the seed layer may include copper or a copper alloy. Other metals such as silver, gold, aluminum, palladium, nickel, nickel alloys, tungsten alloys, chromium, chromium alloys, and combinations thereof may also be included.

A formation process for forming UBMs includes depositing a blanket UBM layer, forming and patterning a mask (which may be a photo resist, not shown), with portions of the blanket UBM layer being exposed through the opening in the mask. The exposed portions may then be removed by an etching process. Then the mask may be removed to reveal the UBMs.

As also shown in FIG. 13, a ball portion of the electrical connectors 360 are formed. After the formation of UBMs (if used), the illustrated package may be placed into a plating solution (not shown), and a plating step may be performed to complete the electrical connectors 360 on the UBMs. Other processes may be used to form the connectors 360.

Figure 14:
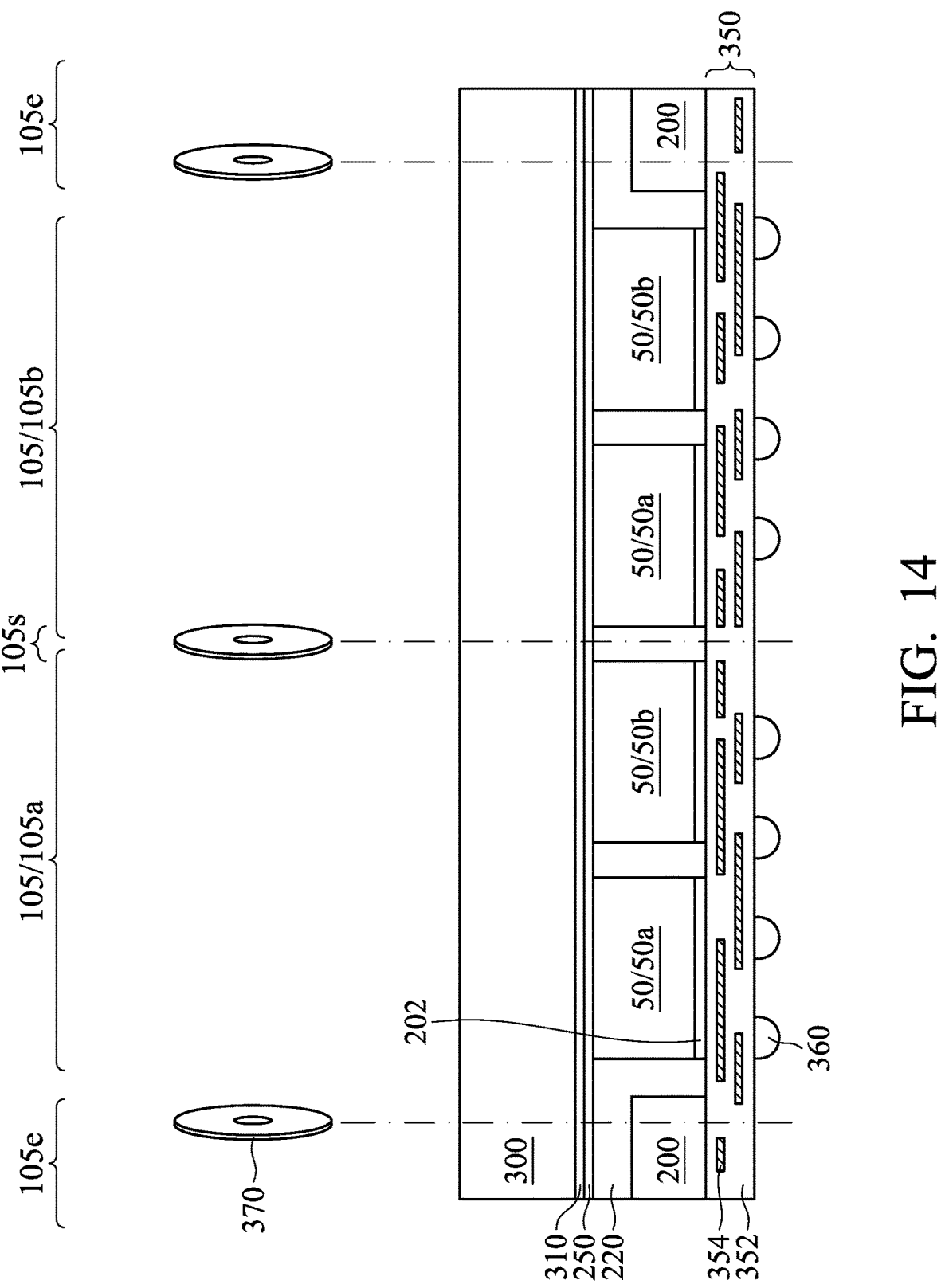

In FIG. 14, a singulation process 370 is used along the scribe lines 105s to separate the structure of FIG. 13 into packages 105. The singulation process 370 may use a die saw, laser, etching, the like and so forth to cut through the structure.

The resulting singulated package can be seen in FIGS. 15A, 15B, 15C, and 15D. In FIG. 15A, a portion of the first dielectric layer 200 remains with the package 105 on one side of the package 105. In FIG. 15B, a portion of the first dielectric layer 200 remains with the package 105 on two or more sides of the package 105. In FIGS. 15C and 15D the workpiece 100 is not removed. In FIG. 15D, the embodiment illustrated in FIG. 11 may be substituted to remove the portion of the second dielectric layer 220 disposed between the first dielectric layer 200 and the second workpiece 300.

In FIG. 14, a singulation process 370 is used along the scribe lines 105s to separate the structure of FIG. 13 into packages 105. The singulation process 370 may use a die saw, laser, etching, the like and so forth to cut through the structure.

The resulting singulated package can be seen in FIGS. 15A, 15B, 15C, and 15D. In FIG. 15A, a portion of the first dielectric layer 200 remains with the package 105 on one side of the package 105. In FIG. 15B, a portion of the first dielectric layer 200 remains with the package 105 on two or more sides of the package 105. In FIGS. 15C and 15D the workpiece 100 is not removed. In FIG. 15D, the embodiment illustrated in FIG. 11 may be substituted to remove the portion of the second dielectric layer 220 disposed between the first dielectric layer 200 and the second workpiece 300.

Embodiments advantageously utilize a separate dielectric layer to pre-form on the edge regions of a workpiece. The separate dielectric layer provides stability in the edge region to that the surface of the encapsulating dielectric layer does not slump at the edges, which would otherwise cause potential bonding issues in wafer-to-wafer bonds. Because the edge dielectric layer provides stability, the upper surface of the workpiece has greater planarity and provides a more stable, straight, and smooth surface on which to bond in a bonding layer directly with the bonding layer of another workpiece.

One embodiment is a method including attaching a device die to a substrate. The method also includes forming a first dielectric layer on the substrate between an outer edge of the device die and an outer edge of the substrate. The method also includes forming a second dielectric layer on the substrate between the device die and the first dielectric layer. The method also includes planarizing the second dielectric layer to level an upper surface of the second dielectric layer with an upper surface of the device die. The method also includes depositing a bonding dielectric layer on the upper surface of the second dielectric layer and on the upper surface of the device die.

In an embodiment, the substrate is a first substrate, and the method may include: bonding a second substrate to the bonding dielectric layer by a second bonding dielectric layer. In an embodiment, bonding the second substrate causes cross-linking of materials of the bonding dielectric layer and the second bonding dielectric layer, a number of bonds per unit area in a middle of the second substrate being within 10% of a number of bonds per unit area at an edge of the second substrate. In an embodiment, the method may include: singulating a package including a portion of the first substrate, a portion of the second substrate, and the device die. In an embodiment, forming the first dielectric layer may include: depositing a photosensitive dielectric material over the device die and the substrate; developing the photosensitive dielectric material so that only a portion of the photosensitive dielectric material remains between the outer edge of the device die and an outer edge of the substrate; and curing the photosensitive dielectric material into the first dielectric layer. In an embodiment, following curing the photosensitive dielectric material, the first dielectric layer has an upper surface which is lower than an upper surface of the device die, where forming the second dielectric layer further may include forming the second dielectric layer on the first dielectric layer. In an embodiment, depositing the bonding dielectric layer further may include, depositing the bonding dielectric layer directly on an upper surface of the first dielectric layer.

Another embodiment is a method including depositing a first dielectric material over a first integrated circuit device, the first integrated circuit device attached to an upper surface of a first wafer, the first dielectric material extending to an edge of the first wafer. The method also includes patterning the first dielectric material directly, without using a separate photoresist material, to remove a portion of the first dielectric material over and laterally surrounding the first integrated circuit device, a second portion of the first dielectric material remaining in an edge region of the first wafer. The method also includes depositing a second dielectric material over the first integrated circuit device and over the first dielectric material. The method also includes planarizing the second dielectric material to level an upper surface of the first integrated circuit device with an upper surface of the second dielectric material.

In an embodiment, the method may include: patterning the second dielectric material to remove a portion of the second dielectric material disposed on the upper surface of the first integrated circuit device. In an embodiment, the second dielectric material is patterned through an etching process. In an embodiment, the method may include: forming a first bonding dielectric layer over the second dielectric material and over the first integrated circuit device; and bonding the first bonding dielectric layer to a second bonding dielectric layer by a fusion bonding process, the second bonding dielectric layer attached to a second wafer. In an embodiment, a first bond density of a bonding interface between the first bonding dielectric layer and the second bonding dielectric layer at a center of the bonding interface is within 10% of a second bond density of the bonding interface at an edge of the bonding interface. In an embodiment, after planarizing the second dielectric material, a portion of the second dielectric material remains disposed over the first dielectric material. In an embodiment, the first dielectric material may include a negative tone photosensitive material.

Another embodiment is a package including a first package substrate and a second package substrate, a device layer interposed between the first package substrate and the second package substrate. The device layer may include: a device die, a first dielectric structure disposed at a first edge of the device layer, a second dielectric structure laterally surrounding the device die and having a first interface with the first dielectric structure, and a first bonding dielectric layer extending over the second dielectric structure. The device also includes a second bonding dielectric layer attached to the second package substrate at one surface and attached to the first bonding dielectric layer at an opposite surface.

In an embodiment, the first dielectric structure and second dielectric structure have a second interface with each other, the second interface perpendicular to the first interface, a portion of the second dielectric structure interposed between the first bonding dielectric layer and the first dielectric structure. In an embodiment, an interface of the first bonding dielectric layer and the second bonding dielectric layer has a bond density which varies less than 10%. In an embodiment, the device die is a first device die, and may include: a second device die in the device layer, the second dielectric structure interposed between the second device die and the first device die. In an embodiment, the device layer further may include the first dielectric structure disposed at a second edge of the device layer. In an embodiment, the first package substrate is an interposer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:

attaching a device die to a substrate;

forming a first dielectric layer on the substrate between an outer edge of the device die and an outer edge of the substrate, wherein forming the first dielectric layer comprises:

depositing a photosensitive dielectric material over the device die and the substrate;

developing the photosensitive dielectric material so that only a portion of the photosensitive dielectric material remains between the outer edge of the device die and the outer edge of the substrate; and curing the photosensitive dielectric material into the first dielectric layer;

forming a second dielectric layer on the substrate between the device die and the first dielectric layer;

planarizing the second dielectric layer to level an upper surface of the second dielectric layer with an upper surface of the device die; and depositing a bonding dielectric layer on the upper surface of the second dielectric layer and on the upper surface of the device die.

2. The method of claim 1, wherein the substrate is a first substrate, further comprising:

bonding a second substrate to the bonding dielectric layer by a second bonding dielectric layer.

3. The method of claim 2, wherein bonding the second substrate causes cross-linking of materials of the bonding dielectric layer and the second bonding dielectric layer, a number of bonds per unit area in a middle of the second substrate being within 10% of a number of bonds per unit area at an edge of the second substrate.

4. The method of claim 2, further comprising:

singulating a package including a portion of the first substrate, a portion of the second substrate, and the device die.

5. The method of claim 1, wherein following curing the photosensitive dielectric material, the first dielectric layer has an upper surface which is lower than an upper surface of the device die, wherein forming the second dielectric layer further comprises forming the second dielectric layer on the first dielectric layer.

6. The method of claim 1, wherein depositing the bonding dielectric layer further comprises depositing the bonding dielectric layer directly on an upper surface of the first dielectric layer.

7. A method comprising:
   depositing a first dielectric material over a first integrated circuit device, the first integrated circuit device attached to an upper surface of a first wafer, the first dielectric material extending to an edge of the first wafer;
   patterning the first dielectric material directly, without using a separate photoresist material, to remove a portion of the first dielectric material over and laterally surrounding the first integrated circuit device, a second portion of the first dielectric material remaining in an edge region of the first wafer;
   depositing a second dielectric material over the first integrated circuit device and over the first dielectric material; and
   planarizing the second dielectric material to level an upper surface of the first integrated circuit device with an upper surface of the second dielectric material.

8. The method of claim 7, further comprising:
   patterning the second dielectric material to remove a portion of the second dielectric material disposed on the upper surface of the first integrated circuit device.

9. The method of claim 8, wherein the second dielectric material is patterned through an etching process.

10. The method of claim 7, further comprising:
   forming a first bonding dielectric layer over the second dielectric material and over the first integrated circuit device; and
   bonding the first bonding dielectric layer to a second bonding dielectric layer by a fusion bonding process, the second bonding dielectric layer attached to a second wafer.

11. The method of claim 10, wherein a first bond density of a bonding interface between the first bonding dielectric layer and the second bonding dielectric layer at a center of the bonding interface is within 10% of a second bond density of the bonding interface at an edge of the bonding interface.

12. The method of claim 7, wherein after planarizing the second dielectric material, a portion of the second dielectric material remains disposed over the first dielectric material.

13. The method of claim 7, wherein the first dielectric material comprises a negative tone photosensitive material.

14. A package device comprising:
   a first package substrate;
   a second package substrate;
   a device layer interposed between the first package substrate and the second package substrate, the device layer comprising:
      a device die,
      a first dielectric structure disposed at a first edge of the device layer,
      a second dielectric structure laterally surrounding the device die and having a first interface with the first dielectric structure, and
      a first bonding dielectric layer extending over the second dielectric structure; and
   a second bonding dielectric layer attached to the second package substrate at one surface and attached to the first bonding dielectric layer at an opposite surface.

15. The package device of claim 14, wherein the first dielectric structure and the second dielectric structure have a second interface with each other, the second interface perpendicular to the first interface, a portion of the second dielectric structure interposed between the first bonding dielectric layer and the first dielectric structure.

16. The package device of claim 14, wherein an interface of the first bonding dielectric layer and the second bonding dielectric layer has a bond density which varies less than 10%.

17. The package device of claim 14, wherein the device die is a first device die, further comprising:
   a second device die in the device layer, the second dielectric structure interposed between the second device die and the first device die.

18. The package device of claim 14, wherein the device layer further comprises the first dielectric structure disposed at a second edge of the device layer.

19. The package device of claim 14, wherein the first package substrate is an interposer.

20. The method of claim 1, further comprising patterning the second dielectric layer to remove a portion of the second dielectric layer disposed over the device die prior to planarizing the second dielectric layer.

* * * * *